United States Patent [19]

Gerber et al.

[11] Patent Number: 4,607,351
[45] Date of Patent: Aug. 19, 1986

[54] CARTRIDGE MEMORY PROTECTION

[75] Inventors: Jeri L. Gerber; Jorge L. Nazario; Victor M. Simi, all of Lexington, Ky.

[73] Assignee: International Business Machine Corp., Armonk, N.Y.

[21] Appl. No.: 691,022

[22] Filed: Jan. 14, 1985

[51] Int. Cl.$^4$ .............................................. G11C 5/00
[52] U.S. Cl. ..................................... 365/228; 307/66; 365/229
[58] Field of Search .................. 307/66; 365/226, 228, 365/229

[56] References Cited

U.S. PATENT DOCUMENTS

| 3,859,638 | 1/1975 | Hume, Jr. | 365/229 |
| 4,229,804 | 10/1980 | Kolyashi et al. | 364/900 |
| 4,383,184 | 5/1983 | McFarland | 307/66 |
| 4,445,198 | 4/1984 | Eckert | 364/900 |
| 4,485,456 | 11/1984 | Toyoda | 364/900 |

FOREIGN PATENT DOCUMENTS 1554013 10/1979 United Kingdom .

OTHER PUBLICATIONS

IBM Technical Disclosure Bulletin, vol. 15, No. 11, Apr. 1973, entitled "Pluggable Storage Modules," by H. D. Atkinson et al., at pp. 3408–3409.
IBM Technical Disclosure Bulletin, vol. 14, No. 9, Feb. 1972, entitled "Volatile Memory Data Retention," by R. D. Anderson et al., at pp. 2712–2713.

Primary Examiner—Joseph A. Popek
Attorney, Agent, or Firm—John A. Brady

[57] ABSTRACT

Cartridge (1) contains memory (40a–40h) and a back-up battery (13). Terminals (5a–5i) of the cartridge (1) plug into termnals (7a–7i) of a host machine (3). Positive deactivation of the write control is achieved by both the base and emitter of a bipolar transistor (52) being deactivated when the cartridge (1) is unplugged. Battery voltage then appears at read/write control line (64) through resistor (56) connected to the collector of the transistor (52). This brings the control line (64) to the read status and positively protects data in memory (40a–40h) against transient signals, which may occur especially during plug in when the host (3) is activated, or from electrostatic charges.

6 Claims, 1 Drawing Figure

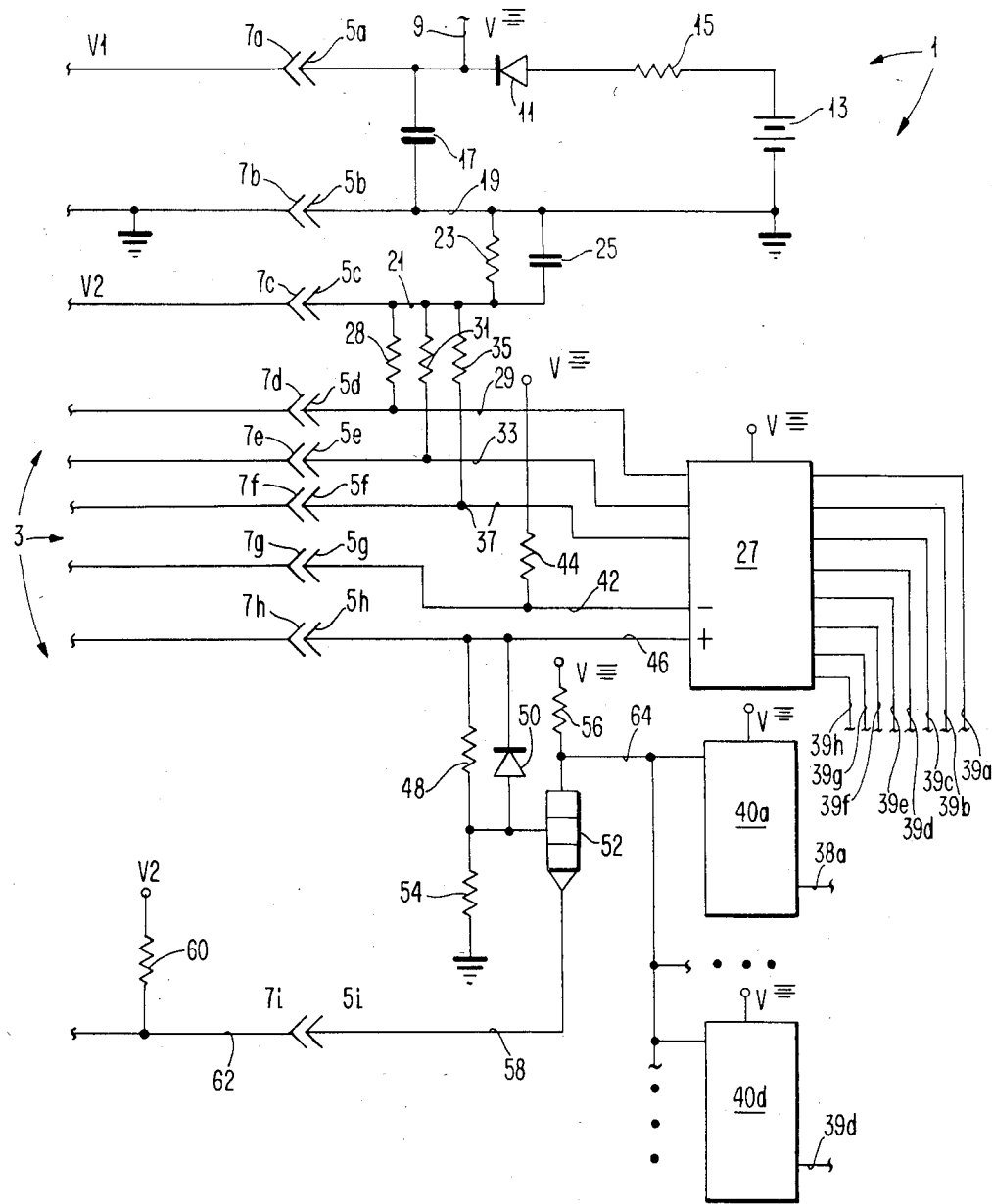

CARTRIDGE MEMORY PROTECTION

TECHNICAL FIELD

This invention relates to circuits to protect data in memory housed in a plug-in cartridge, where such memory has a control line which is activated to alter data stored in the memory. Typically, such memories are on a semiconductor circuit chip mounted on a circuit board supporting the associated circuit elements. This, in turn, is enclosed by a protective housing or cartridge. Contacts on the circuit board mate with contacts from the main machine when the circuit board is inserted. The housing contains a battery which is effective to support minimal memory operation when the cartridge is not plugged in.

BACKGROUND ART

Plug-in memories having batteries effective when unplugged are known, as described, for example, in *IBM Technical Disclosure Bulletin* articles entitled "Pluggable Storage Modules," by Atkinson et al, Vol. 15, No. 11, April 1973, at pp. 3408–3409, and "Volatile Memory Data Retention," by Anderson et al, Vol. 14, No. 9, February 1972, at pp. 2712–2713, and in U.S. Pat. Nos. 4,229,804 to Kobayashi et al and 4,383,184 to McFarland and United Kingdom Patent Specification No. 1,554,013 to Ferranti Limited, published Oct. 17, 1979.

Such prior art is not known to include circuitry operating upon the terminals to memory to protect the memory content. The United Kingdom Patent specification discloses low impedance paths to prevent build-up of static electricity to all terminals of a plug-in memory, which in no way provides a control signal to the memory which might protect data.

U.S. Pat. No. 4,485,456 to Toyoda is to preserving information in a memory which is part of a fixed data processing system having input terminals to the system. Reserve power is provided to the memory and to a latch or logic which applies a write inhibit signal to the memory. A signal to one of the system input terminals is one control signal to that latch or logic.

U.S. Pat. No. 4,445,198 to Eckert is not to a plug-in memory nor to a system having a reserve battery. It addresses a specialized problem of a microprocessor writing incorrect data into an associated memory at low voltage levels occurring during loss of power. To counter this, a voltage input to the memory required to permit writing, which is normally always provided at normal power, is replaced by a voltage of opposite polarity as power is lost.

DISCLOSURE OF THE INVENTION

As cartridge memory is plugged or unplugged to electrical terminals which are currently activated by the host or main machine, loss of data in a random access memory (RAM) of the cartridge through transient currents and the like is a significant concern. It is also possible that data may be lost as a result of electrostatic charges which are built up or applied to the cartridge terminals from normal handling of the cartridge.

Pursuant to this invention, redundant, positive deactivation of the write line control of the memory insures memory contents protection. The write line signal is buffered through a bipolar transistor powered by a battery in the cartridge with the base connected to a terminal which carries a signal from the main machine. This signal is high when any RAM of the cartridge is to be activated or selected. The transistor emitter is connected to a terminal which carries a signal from the main machine which goes low during a write-to-memory operation.

While the cartridge is unplugged, both signals are lacking, each of which deactivates the transistor. With the transistor deactivated, the high signal from the battery is connected through a pull-up resistor to the memory write line, which positively deactivates the memory from write operations and thereby provides a high level of protection to the memory contents.

BRIEF DESCRIPTION OF THE DRAWING

This invention is described in detail by reference to the drawing, which illustrates pertinent circuit elements in a cartridge containing a random access memory, a battery, and terminals; also illustrated are terminals on a host machine to which the cartridge is to be connected and disconnected.

BEST MODE FOR CARRYING OUT THE INVENTION

The elements on the right in the drawing are those in the cartridge and should be understood as housed within a cover forming a cartridge 1, the cartridge being generally suitable to be handled by an individual and plugged into the main or host machine 3. Cartridge 1 has a number of terminals. Only terminals 5a through 5i of cartridge 1 are specifically illustrated as other terminals are not directly related to this invention and need not be described. Each of terminals 5a through 5i is suited to contact a terminal 7a through 7i, respectively, on the main machine 3. Preferably terminals 5a through 5i are rectangular patterns on the edge of a circuit board supporting electronic elements in a cartridge while terminals 7a through 7i are resilient contacts which press against the corresponding terminal 5a through 5i, respectively, to make electrical contact. Such connectors may be entirely conventional, the drawing illustration being symbolic only and not intended to specify and specific structure.

Cartridge terminal 5a connects to a battery voltage lead 9 and to diode 11. Where the voltage on line 9 is indicated in the drawing, it is indicated as V followed by the common symbol for battery. This emphasizes that the voltage is supplied by battery 13 of cartridge 1 when the cartridge 1 is not powered by the host machine over contact 7a. Contact 7a normally carries a voltage V1 which is slightly larger than the voltage of battery 13, thereby back-biasing diode 11 and providing power to line 9. When the cartridge is unplugged, diode 11 is forward biased and the voltage on line 9 is provided by battery 13.

Terminals 5b and 7b are connected to a ground reference level. Resistor 15, between battery 13 and diode 11, is a current limiter and is used as a safety measure to inhibit charging of the battery in case diode 11 fails. Should diode 11 present a short circuit when cartridge 1 is plugged in, the main machine 3 would have the capability of supplying current to battery 13 which would damage battery 13.

Capacitor 17 is illustrative of a bank of capacitors or the like which stores sufficient energy to assure continuing power to provide adequate circuit operation immediately after loss of V1 and until battery 13 stabilizes the circuit.

Terminal 7c of host machine 3 provides a voltage V2. V2 is electrically separate from V1, but in this circuit has the same voltage magnitude. V2 is connected to ground through terminal 5c, line 21 from terminal 5c and through resistor 23 in parallel with capacitor 25. The resistor/capacitor combination circuit is composed of resistor 23 and capacitor 25 of sizes to be an insignificant part of the theoretical direct current operation of the circuit, but to act as a shunt to ground of momentary high currents.

Terminals 7d, 7e and 7f of main machine 3 carry binary logic to select one of eight lines out of chip select logic 27. This is effectuated by line 21, carrying V2, connected through resistor 28 to line 29 to terminal 5d; through resistor 31 to line 33 to terminal 5e; and through resistor 35 to line 37 to terminal 5f. To define a RAM chip selection, terminals 7d, 7e and 7f will each have applied V2 or ground voltage by the host 3. For example, for one selection, terminal 7d might be brought to V2, terminal 7e might be brought to ground, and terminal 7f might be brought to V2. Lines 29 and 37 thus are at V2 as there is no voltage difference across pull-up resistors and 28 and 35. The ground applied to terminal 7e results in ground on line 33 and a drop of V2 across resistor 31.

Chip select circuit 27 is a standard element (specifically, a 74HC138 3-8 decoder) adapted to receive the three inputs and having eight different possible output configurations of high and low signals to provide a low signal on any one of eight output lines 39a through 39h. Each output line, when low, selects or activates one memory element or chip 40a-40h (only 40a and 40d being specifically shown on the drawing).

Chip select circuit 27 has two control inputs of specific interest with respect to this invention and therefore shown on the drawing. One is a deactivating input received on line 42 from terminal 5g. Circuit 27 is deactivated on a high input signal on line 42, and a minus sign is therefore shown at the connection of line 42 with circuit 27 indicating that inverse response. Line 42 is connected to voltage supply line 9 through resistor 44. When cartridge 1 is unplugged, no current can flow through resistor 44, and the undiminished battery voltage is an input to circuit 27 from line 42. This is a high voltage whch deactivates circuit 27, and deactivation of circuit 27 prevents low signals on lines 39a through 39h. When cartridge 1 is plugged into the host machine 3, the host machine applies a high voltage on terminal 7g only immediately after initial plug-in occurs, while all terminals may not be in place. (This signal may be provided by data processing capabilities of host machine 3, responding to, for example, the sensing of a terminal similar to terminals 5a-5i, but located to contact a mating terminal similar to terminals 7a-7h approximately as early as the earliest other terminals contacted). After initial plug-in, host machine 3 continuously applies ground to terminal 7g, thereby applying ground to line 42 and resulting in current through resistor 44 to maintain line 42 at the ground level.

The input to chip select circuit 27 on line 46 is also a select or control input to circuit 27. Since circuit 27 is activated by a high level signal, the symbol at that input of circuit 27 is a plus sign. Line 46 connects circuit 27 to terminal 5h. Corresponding terminal 7h from host machine 3 is brought high when one of the memory chips 40a through 40h in cartridge 1 is selected by host machine 3.

Line 46 is connected through resistor 48 in parallel with normally back-biased diode 50 to the base of a bipolar switching transistor 52 (specifically, a 2N2222A switching transistor). A second resistor 54, which is of relatively large magnitude, is connected between the base of transistor 52 and ground. Resistor 54 is large enough to not influence theoretical steady-state operation, but helps to speed transistor 52 turn off and to keep line 46 near ground potential when the cartridge is unplugged. Diode 50 quickly removes charge from the transistor base region when the voltage level on line 46 drops.

The collector of transistor 52 is connected to the battery voltage on line 9 through resistor 56. The emitter of transistor 52 is connected through line 58 to terminal 5i. Terminal 5i plugs into terminal 7i of host machine 3. Terminal 7i normally carries V2 through resistor 60, which connects to terminal 7i at line 62. The main machine 3 applies an open circuit on line 62 except when the operation is to write into a memory 40a-40h. In writing to memory, ground is applied on, line 62, and, through terminal 5i and line 58, to the emitter of transistor 52. Simultaneously, a high level is applied to line 46.

Line 64, from the collector of transistor 52, is connected as a write control input to each memory chip 40a through 40h. Each memory element or chip 40a through 40h contains thousands of memory cells, each of which typically for energy conservation are cross-coupled latches, and each also contains associated access and control circuits for all the memory cells. Specifically, in this embodiment, each memory chip 40a through 40h is a TC5517 Toshiba Corp. CMOS static RAM, but, with respect to this invention, chips 40a through 40h may take any form having a high read control input. Such a control typically is an input to logic providing a single output signal to isolate input data lines from the memory when the read signal is high. When the read signal is low, and chip select and any other inputs to the logic are met, the output signal opens effective communication from the data lines to memory. This dual action results in such a control input having the common terminology: read/write line.

Design of memories with such a read/write line is common and very widely practiced. An activated read status on the line aids in preventing the existing status of individual memory cells from being altered by transient signals which might occur during sensing of a cell for reading purposes. The specifics of memory design may vary with the manufacturer of the memory unit 40a through 40h. This invention achieves some protection with any memory having a read/write control with some degree of effectiveness, as that degree of effectiveness is brought into operation by this invention when a cartridge containing such a memory is unplugged.

As shown in the drawing, the voltage on line 9 is applied as an operating voltage to the memory chips 40a through 40h. When the cartridge is unplugged, it is necessary to power memory chips 40a through 40h to preserve data. The connection of line 9 to chip select circuit 27 is not essential to the preservation of data, but serves as secondary protection as the powering the circuit 27 permits the chip select lines to be held in the inactive, high state.

When cartridge 1 is unplugged, battery 13 is effective to maintain voltage on line 9. Chip select circuit 27 receives operating voltage from battery 13, but is positively disabled by the high voltage on line 42. The voltages on lines 29, 33 and 37, which are the selection input lines to circuit 27, and on line 46, are not connected to a reference and may go high from static charges. However, the high voltage on line 42 maintains deselection of circuit 27.

When cartridge 3 unplugged, transistor 52 is positively biased off as it is a current activated device and both terminals 5h and 5i are not connected to any reference. This prevents current from flowing through resistor 56 and applies the voltage from battery 13 on line 64. Line 64 is connected to the read/write control of memories 40a through 40h, and the high signal on line 64 is interpreted as a read input, thereby protecting any data in the memories 40a–40h from write operations.

When cartridge 1 is plugged in, all logic and power signals on the terminals 7a through 7g are directly connected to cartridge elements to be controlled or powered except terminal 7i which is connected to the emitter of transistor 52 instead of more directly to line 64 and, similarly, terminal 7h which is connected to the base of transistor 52. Host machine 3 applies a high signal to terminal 7h each time cartridge 1 is activated, applying a high signal to line 46. This signal produces a current through resistor 48 and through the base-emitter circuit of transistor 52 each time a write operation is selected for cartridge 1 by terminal 7i being brought low. That causes an amplified current to flow through transistor 52, thereby reducing the voltage on line 64 sufficient to select the write operation in the memory 40a–40h selected by circuit 27.

Alternative circuit implementations will be apparent. Accordingly, coverage should not be limited to the specific embodiment disclosed, but should be provided by law, with particular reference to the following claims.

What is claimed is:

1. A memory unit having a battery and at least one memory element connected to be powered by said battery, said memory element having one control line activating said memory element for reading at a first voltage level and for writing at a second voltage level, a bipolar transistor in said memory unit connected with said battery in the collector-to-emitter circuit of said transistor, a first terminal for connection to a host machine connected to the base of said transistor and a second terminal for connection to said host machine connected to the emitter of said transistor, and means connecting the collector of said bipolar transistor to said one control line to provide said first voltage level when no current flows between said first terminal and said second terminal.

2. The memory unit as in claim 1 also comprising a chip select circuit to select a memory element in said unit from signals applied to said unit and having a control input for deactivating said chip select circuit when said control input is at a predetermined voltage level and means connecting said battery to said control input to apply said predetermined voltage level to said control input when said unit is not connected to said host machine.

3. A cartridge containing an electronic, digital memory, a voltage source, and a set of terminals to be plugged into terminals of a host machine, said memory having a read control input effective to condition said memory to read data from said memory when said read control input is at a first voltage level, an active element having a first side and a second side and two control terminals connected together to control said active element to a conductive status and a non-conductive status between said first side and said second side, means connecting said voltage source to one of said first side and said second side, and means connecting said read control input to one of said first side and said second side, the level of said voltage source and the location of said connections of said voltage source and said read control input providing said first voltage level to said read control input from said voltage source when said active element is controlled to said non-conductive status by said control terminals not being in a completed circuit and providing a second voltage level to said read control input when said active element is controlled to said conductive status.

4. The cartridge as in claim 3 in which said active element is a bipolar transistor, said first side is the collector of said transistor, said second side is the emitter of said transistor, and said control terminals are the base of said transistor and said emitter, and in which said voltage source is connected through a resistor to said collector.

5. The cartridge as in claim 4 also comprising a chip select circuit to select a memory chip in said cartridge from signals applied to said cartridge and having a control input for deactivating said chip select circuit when said control input is at a predetermined voltage level and means connecting said voltage source to said control input to apply said predetermined voltage level to said control input when said cartridge is not connected to said host machine.

6. The cartridge as in claim 3 also comprising a chip select circuit to select a memory chip in said cartridge from signals applied to said cartridge and having a control input for deactivating said chip select circuit when said control input is at a predetermined voltage level and means connecting said voltage source to said control input to apply said predetermined voltage level to said control input when said cartridge is not connected to said host machine.

* * * * *